(12) United States Patent
Liu

(10) Patent No.: US 9,570,806 B1
(45) Date of Patent: Feb. 14, 2017

(54) DUAL BAND TRANSMITTER

(71) Applicant: NXP B.V., Eindhoven (NL)

(72) Inventor: Qinghai Liu, Shanghai (CN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/219,247

(22) Filed: Jul. 25, 2016

(30) Foreign Application Priority Data

Aug. 17, 2015 (CN) .......................... 2015 1 0505498

(51) Int. Cl.
| | | |
|---|---|---|
| H04M 1/00 | (2006.01) | |
| H01Q 5/50 | (2015.01) | |
| H01Q 5/20 | (2015.01) | |
| H01Q 1/48 | (2006.01) | |
| H03H 7/38 | (2006.01) | |
| H03F 3/19 | (2006.01) | |
| H03F 3/21 | (2006.01) | |
| H03F 3/217 | (2006.01) | |
| H04L 25/02 | (2006.01) | |
| H04B 1/04 | (2006.01) | |

(52) U.S. Cl.
CPC .................. *H01Q 5/50* (2015.01); *H01Q 1/48* (2013.01); *H01Q 5/20* (2015.01); *H03F 3/19* (2013.01); *H03F 3/21* (2013.01); *H03F 3/2176* (2013.01); *H03H 7/38* (2013.01); *H04B 1/0483* (2013.01); *H04L 25/0278* (2013.01); *H03F 2200/387* (2013.01); *H03F 2200/451* (2013.01); *H03H 2007/386* (2013.01)

(58) Field of Classification Search
USPC ....................................... 455/552.1, 107, 91
See application file for complete search history.

(56) References Cited

U.S. PATENT DOCUMENTS

| | | | |
|---|---|---|---|
| 5,134,392 A | 7/1992 | Takeuchi | |
| 6,031,465 A | 2/2000 | Burgess | |
| 6,556,630 B1 * | 4/2003 | Brinsfield | .............. H04B 1/406 |
| | | | 340/870.11 |
| 7,176,845 B2 * | 2/2007 | Fabrega-Sanchez | ............. G01R 27/2694 |
| | | | 343/861 |
| 8,330,570 B2 | 12/2012 | Martin | |
| 8,542,078 B2 * | 9/2013 | de Jongh | ................. H03H 7/40 |
| | | | 333/32 |
| 2011/0163921 A1 | 7/2011 | Chirila | |

* cited by examiner

*Primary Examiner* — Sonny Trinh
(74) *Attorney, Agent, or Firm* — Charles E. Bergere

(57) ABSTRACT

A dual band transmitter for transmitting a data signal in a first frequency or second frequency band. An antenna receives and sends data in one of the first and second frequency bands. An impedance matching network is connected in series with the antenna, and to a first node, and matches the impedance of the antenna to a predetermined value. The impedance matching network includes first and second antenna matching networks. The first antenna matching network is connected in series with the second matching network. In the first frequency band, the first antenna matching network matches the impedance of the antenna to the predetermined value, and in the second frequency band the second antenna matching network matches the impedance of the antenna to the predetermined value without affecting the first antenna matching network's matching in the first frequency band.

10 Claims, 4 Drawing Sheets

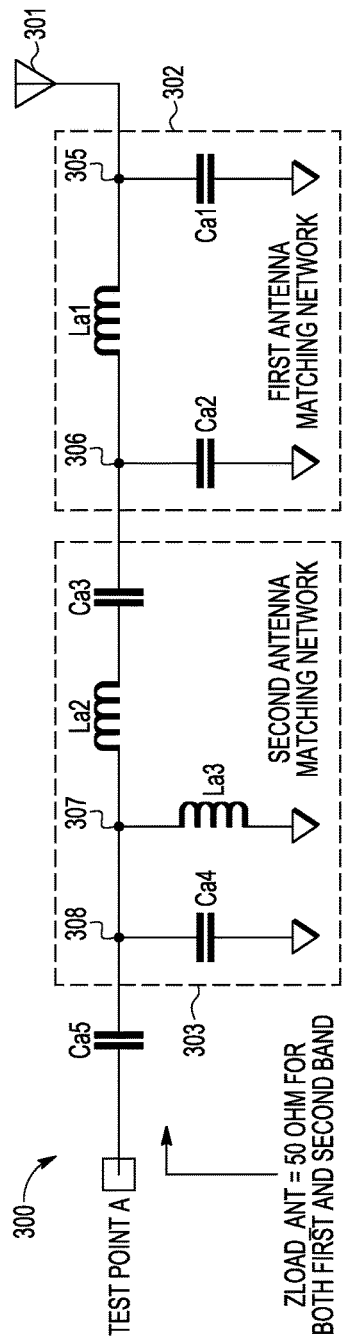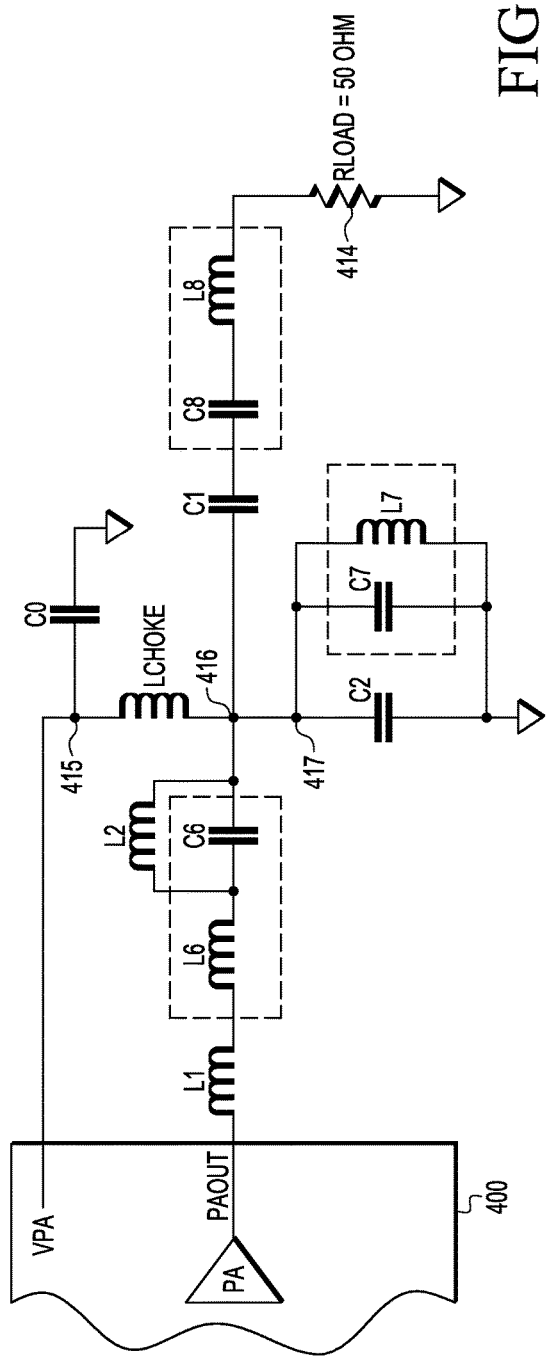

DUAL BAND TRANSMITTER

BACKGROUND

The present application relates to dual-band transmitters, and, more particularly to dual-band transmitters for Remote Keyless Entry (RKE) and Passive keyless Entry Systems (PES).

In recent years, more and more car manufacturers encounter signal interference problems during the UHF signal communication of remote keyless entry (RKE) and passive keyless system (PES). In the case of a single frequency band, hopping may be used to solve this problem. However, if the interfering signal is strong and with a broad band, then frequency band hopping may not solve the interference problem. If hopping occurs in two frequency bands, then the probability of successful communication will be greatly improved. In car access systems, typically a key fob includes a transmitter for transmitting signals to a receiver that receives the signals. A dual-band transmitter in the key fob uses either two antennas or a single antenna having an RF switch to achieve dual-band emission, but these solutions require a large PCB area, and an RF switch increases cost. Further, the design of such a dual-band transmitter is very complicated.

SUMMARY

This summary is provided to introduce a selection of concepts in a simplified form that are further described below in the Detailed Description. This summary is not intended to be relied on to identify key features or essential features of the claimed subject matter, nor is it intended to be used to limit the scope of the claimed subject matter.

The present invention provides a low cost dual-band transmitter with low loss that is easy to implement.

In one embodiment, the present invention is a dual band transmitter for transmitting a data signal in a first frequency band or a second frequency band. The dual band transmitter comprises an antenna for receiving and sending the data in the first frequency band or the second frequency band. An antenna impedance matching network is connected in series with the antenna and to a first node for matching the impedance of the antenna to a predetermined value. The antenna impedance matching network includes first and second series connected antenna matching networks. In the first frequency band, the first antenna matching network matches the antenna impedance to the predetermined value, and in the second frequency band the second antenna matching network matches the antenna impedance to the predetermined value without affecting the matching of the first antenna network.

The dual-band transmitter of the present invention can achieve impedance matching for two frequency bands as well as achieving low-loss. Since the antenna of the present invention does not need to be modified, the transmitter does not require additional switches, so the dual-band transmitter of the present invention is low cost, easy to implement, and easy to test.

BRIEF DESCRIPTION OF THE DRAWINGS

So that the manner in which the above recited features of the present application can be understood in detail, a more particular description of the application, briefly summarized above, may be had by reference to embodiments, some of which are illustrated in the appended drawings. It is to be noted, however, that the appended drawings illustrate only typical embodiments of this application and are therefore not to be considered limiting of its scope, for the application may admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

FIG. 3 is an antenna matching network in the transmitter in accordance with an exemplary embodiment of the present invention;

FIG. 4 is an amplifier matching network in the transmitter in accordance with an exemplary embodiment of the present invention;

DETAILED DESCRIPTION

Key fobs are used in car access control systems. The key fob is also known as a remote control. The remote control send an encrypted signal to a car receiver over a dedicated UHF frequency. One or more frequencies may be used to modulate the base band signal. One frequency or nearside hopping topology is often used in remote keyless entry, which can enhance the robustness of the communication protocol. However, when the interference signal is strong, the frequency hopping may not help overcome interference.

In car access applications, the following bands are widely used.

A—315 MHz band
B—434 MHz band
C—868 MHz band
D—925 MHz band

In order to achieve dual-band transmission protocol and support dual-band without the need for hardware changes, the transmitter must use software to achieve dual-band configuration and transmit signals.

In the RKE/PES key fob applications, a PCB loop antenna is commonly used because the "hand-held" requirement influences the antenna's performance and limits the size of the PCB. The loop antenna is relatively small and has various shapes. The loop antenna can effectively reduce the negative requirements of being hand-held. Due to the small PCB area, two antennas cannot be set in the key card design. Therefore, the use of one antenna in a dual-band transmitter antenna is a good choice.

Figure 1:
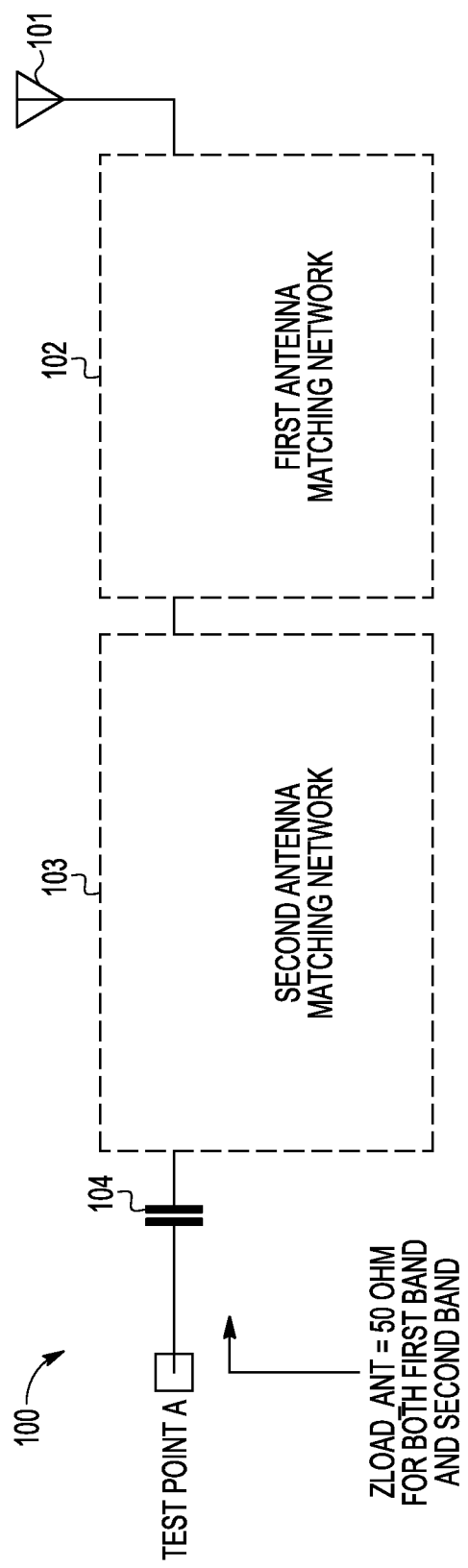
FIG. 1 is a schematic block diagram of a dual band transmitter in accordance with an exemplary embodiment of the present invention.

FIG. 1 is a block diagram of the antenna impedance matching of a transmitter 100 according to an exemplary embodiment of the present invention. The transmitter 100 comprises an antenna 101, a first antenna matching network 102, and a second antenna matching network 103.

In order to achieve a dual-band transmitter, the transmitter 100 should integrates fractional-N PLL, which only one crystal generates the carrier signals of at least two frequency bands. Otherwise it would be more complicated to implement the dual-band transmission protocol. The impedance Zload_ant at test point A (TPA) is the antenna impedance after an antenna matching network. The value of Zload_ant typically is 50 ohms. The antenna 101 may be the media used to transmit or receive the electromagnetic signals in a first frequency band or a second frequency band. When the antenna 101 receives a signal in the first frequency band, the first antenna matching network 102 matches the antenna impedance, so that the impedance of the antenna 101 after the first antenna matching network 102 reaches a predetermined value. The second antenna matching network 103 does not affect the first antenna matching network matching in the first frequency band.

After the first antenna matching network 102 completes the impedance matching for the first frequency band, the second antenna matching network 103 matches the antenna impedance in the second frequency band. That is, when the antenna 101 receives a signal in the second frequency band, the second antenna matching network 103 does the impedance matching, so that the impedance of the antenna 101 after the second antenna matching network 103 reaches the predetermined value. In other embodiments of the present invention, the transmitter 100 may also include a compensation capacitor 104, which helps to more accurately match the antenna impedance to a predetermined value. In the preferred embodiment, the second frequency band is different from the first frequency band and the second frequency band is not a multiple of the first frequency band. In one embodiment, the first frequency band is 315 MHz, and the second frequency band is 434 MHz. In another embodiment, the first frequency band is 868 MHz, and the second frequency band is 925 MHz.

In one embodiment, the first antenna matching network 102 and the second antenna matching network 103 are connected in series. In other embodiments, the position of the first antenna matching network 102 and the second antenna matching network 103 can be interchanged.

Figure 2:
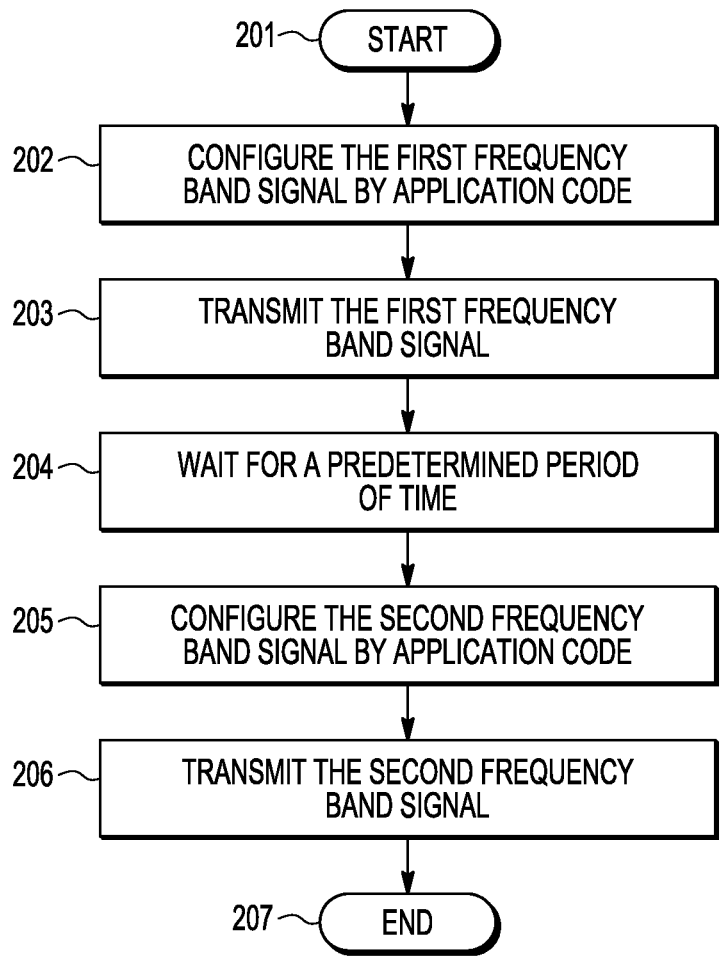
FIG. 2 is a flow chart of the operation of the transmitter in accordance with an exemplary embodiment of the present invention.

FIG. 2 is a flow chart of the operation of the transmitter according to an exemplary embodiment of the present invention. Buttons are set on the key card board (and accessible via the key fob). In step 201, a button is pressed to start. In step 202, the first frequency band signal is configured by application code. In step 203, the first frequency band signal is transmitted. In step 204, waiting for a predetermined period of time is performed. In step 205, the second frequency band signal is configured by application code. In step 206, the second frequency band signal is transmitted, and the operation ends at step 207.

FIG. 3 shows the antenna impedance matching of a transmitter 300 according to an exemplary embodiment of the present invention.

Referring to FIG. 3, the transmitter 300 includes an antenna 301, a first antenna matching network 302, and a second antenna matching network 303. The first antenna matching network 302 includes capacitors Ca1 and Ca2 respectively coupled between nodes 305, 306 and ground, and inductor La1 coupled between nodes 305 and 306. The second antenna matching network 303 includes capacitor Ca3 and inductor La2 coupled in series between nodes 306 and 307, and inductor La3 and capacitor Ca4 respectively coupled between nodes 307, 308 and ground. In other embodiments, the transmitter 300 further comprises a compensation capacitor Ca5 coupled in series with the first antenna matching network 302 and the second matching network 303.

The matching in the first frequency band is described below. Referring to FIG. 3, the capacitors Ca1, Ca2 and inductors La1 are used to match the antenna impedance at the test point A to a predetermined value, the predetermined value is typically 50 ohms. However not all of the capacitors Ca1, Ca2 or inductor La1 are necessarily required. According to the antenna characteristics and filter form, in other embodiments, "capacitor Ca1 and inductor La1" or "capacitor Ca2 and inductor La1" can also realize the desired impedance.

The matching in the second frequency band is described below. In one embodiment, the second antenna matching network 303 comprises capacitor Ca3, inductor La2, inductor La3 and capacitor Ca4. The second antenna matching network 303 should meet the following requirements:

a. The capacitor Ca3 and the inductor La2 resonate at the frequency in the first frequency band;
    b. The inductor Ca4 and the capacitor La3 resonate at the frequency of the first frequency band; and
    c. The equivalent impedance of the capacitor Ca3 and the inductor La2, the inductor La3 and the capacitor Ca4 transforms the antenna impedance to the predetermined value for the second frequency band.

According to the above-criteria, the right elements will be determined for a dual-band antenna impedance matched to 50 ohms at test point TPA. In one embodiment, due to the presence of PCB and parasitic parameters, some measurements can be taken to compensate for the parasitic parameters, and the capacitor Ca5 can be used to more precisely match the impedance at TPA to 50 ohms.

In the RKE/PES applications, the transmission of signals is in line with transverse electromagnetic wave (TEM wave), so that the impedance matching solution also can be applied to the receiver for dual-band antenna matching.

FIG. 4 shows an amplifier matching network in the transmitter according to an exemplary embodiment of the present invention.

The transmitter chip can integrate different types of power amplifiers, such as class C, class E and class F amplifiers. According to one embodiment, the amplifier is an inductor—Pre-Class E amplifier (developed from the traditional class E amplifier). Those of skill in the art will appreciate that other types of amplifiers may be used for impedance matching.

In order to achieve the two bands with a small loss dual-band transmission, and get the best load impedance at $PA_{OUT}$, the power amplifier matching network needs to be optimized.

Referring to FIG. 4, a transmitter 400 comprises a first set of elements, comprising an amplifier (PA), an inductor L1, a capacitor C1, a capacitor C2, a choke inductor Lchoke, and capacitor C0. The inductor L1 is coupled between PAout and node 416. The capacitor C1 is coupled between node 416 and a load 414. The capacitor C2 is coupled between node 416 and the ground. The choke inductor Lchoke is coupled between nodes 416 and 415. The capacitor C0 is coupled between node 415 and ground. The inductor L1, the capacitor C1, the capacitor C2, the choke inductor Lchoke and capacitor C0 are for impedance matching for the first frequency band.

Figure 5:
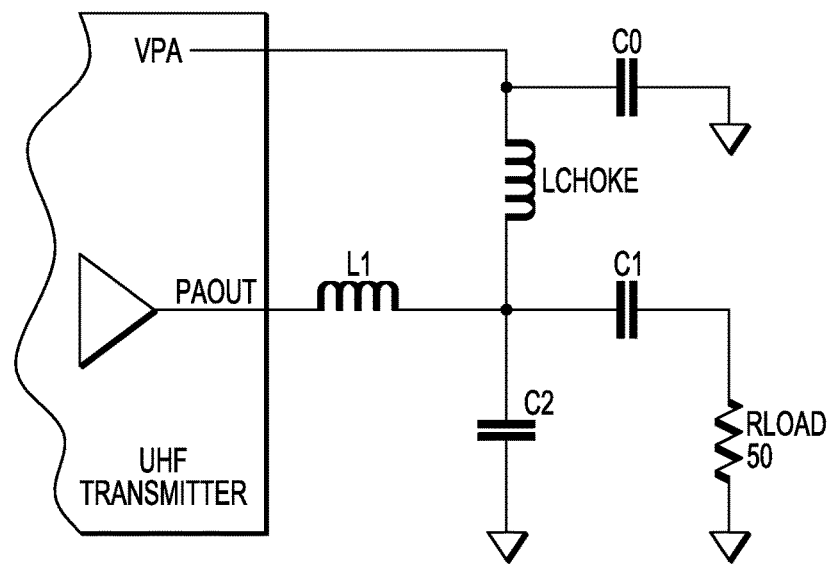
FIG. 5 is an equivalent circuit of FIG. 4 operating in the first frequency band.

FIG. 5 is an equivalent circuit diagram of FIG. 4 at the first frequency band. Referring to FIG. 5, PA impedance matching network includes the inductor L1, the capacitor C1, the capacitor C2, the choke inductor Lchoke, and capacitor C0. These elements are tuned to determine the desired load impedance for the first frequency band. The value of the inductor L1, capacitor C1, the capacitor C2, the choke inductor Lchoke and capacitor C0 in FIG. 4 are equal to the values of the corresponding elements in FIG. 5.

Returning to FIG. 4, the transmitter further comprises these three sets of elements: an inductor L6, an inductor L2 and a capacitor of C6; an inductor L7 and a capacitor C7; and a capacitor C8 and an inductor L8. All of these three sets of elements resonate at the frequency in the first frequency band. Therefore, for the first frequency band, matching network is equivalent to inductor L1, the capacitor C1, the capacitor C2, and choke inductor Lchoke and capacitor C0.

Figure 6:
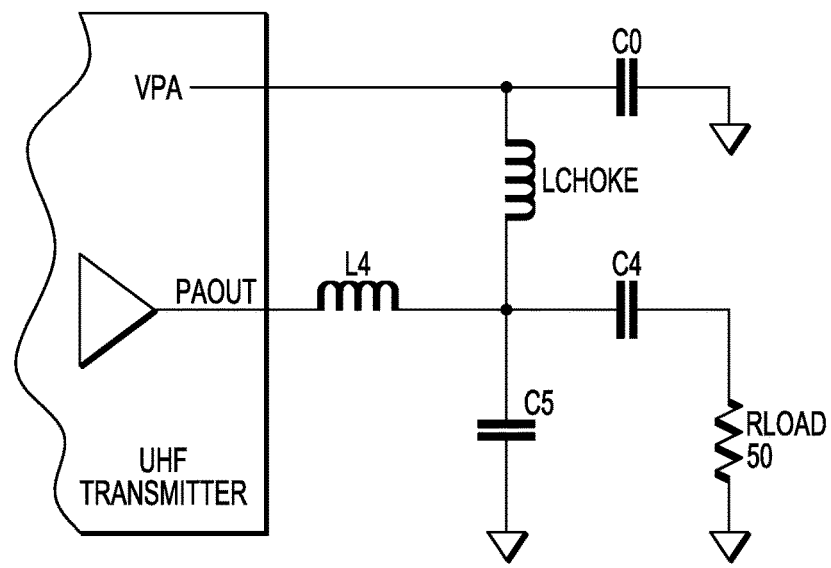
FIG. 6 is an equivalent circuit of FIG. 4 operating in the second frequency band.

FIG. 6 is an equivalent circuit of FIG. 4 at the second frequency band. Referring to FIG. 6, PA impedance matching network includes an inductor L4, a capacitor C4, a capacitor C5, choke inductor Lchoke and capacitor C0. Turning these elements to determine the desired load impedance for the second frequency band. For simplicity, choke inductor Lchoke and capacitor C0 can use the same value of the corresponding elements in FIG. 5 for the first frequency band.

$$ZL4 = ZL1 + ZL6 + \frac{ZL2 * ZC6}{ZL2 + ZC6} \quad (1\text{-}1)$$

$$\frac{1}{ZC5} = \frac{1}{ZC2} + \frac{1}{ZC7} + \frac{1}{ZL7} \quad (1\text{-}2)$$

$$ZC4 = ZC1 + ZL8 + ZC8 \quad (1\text{-}3)$$

wherein ZL1, ZC1, ZC2, ZL4, ZC4, ZC5, ZL2, ZL6, ZC6, ZL7, ZC7, ZL8 and ZC8 represent the impedance value of L1, C1, C2, L4, C4, C5, L2, L6, C6, L7, C7, L8 and C8. Because the impedance value of L1, C1, C2, L4, C4 and C5 may be determined in the practical PCB turning the first frequency band matching (see FIG. 5) or the second frequency band matching (see FIG. 6). By the above equations 1-1, 1-2 and 1-3 the impedance value of L2, L6, C6, L7, C7, L8 and C8 in FIG. 4 can be determined. Finally, based on a predetermined value (e.g., 50 ohms) of the antenna impedance, the PA matching network tunes the PA load impedance, whereby the optimum load impedance values for the two frequency bands can be achieved, and then the optimal transmit power and performance are achieved.

In other embodiments, in order to save PCB area, some of the series and parallel elements in FIG. 4 can be modified or combined into one element according to the actual situation.

In one embodiment, the matching network in the inductor—Pre-Class E amplifier is used. This matching network is also applicable to Class C, E or F class power amplifier.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A dual band transmitter for transmitting a signal in one of a first frequency band and a second frequency band, wherein the dual band transmitter comprises:
   an antenna for transmitting and receiving the signal in one of the first and second frequency bands; and
   an antenna impedance matching network connected in series with the antenna and to a first node, the antenna impedance matching network for matching the impedance of the antenna to a predetermined value;
   wherein the antenna impedance matching network comprises a first antenna matching network and a second antenna matching network, the first antenna matching network connected in series with the second matching network,
   wherein the first antenna matching network includes a first capacitor coupled between the first node and ground, a first inductor coupled between the first node and a second node, and a second capacitor coupled between the second node and ground,
   wherein the second antenna matching network includes a first set of elements including a third capacitor and a second inductor coupled in series between the second node and a third node, and a second set of elements including a third inductor and a fourth capacitor coupled in parallel between the third node and ground, wherein the first and second sets of elements resonant at the frequency in the first frequency band, and
   wherein in the first frequency band, the first antenna matching network matches the impedance of the antenna to the predetermined value, and in the second frequency band, the second antenna matching network matches the impedance of the antenna to the predetermined value without affecting the matching of the first antenna network in the first frequency band.

2. The transmitter of claim 1, wherein the signal in one of the first and second frequency bands is a Ultra-High Frequency (UHF) signal.

3. The transmitter of claim 1, wherein the predetermined value is 50 ohms.

4. The transmitter of claim 1, wherein the antenna impedance matching network further includes a compensation capacitor coupled in series between the second antenna impedance matching network and an antenna impedance test point.

5. The transmitter of claim 4, wherein the transmitter further comprises a power amplifier having an output connected to the first inductor.

6. The transmitter of claim 5, wherein the power amplifier is one of a class C amplifier, E class amplifier and F class amplifier.

7. The transmitter of claim 5, further comprising an amplifier impedance matching network for matching a load impedance to the predetermined value for one of the first frequency band and the second frequency band.

8. The transmitter of claim 7, wherein the amplifier impedance matching network comprises a third set of elements including:
   a fourth inductor coupled between a fifth node and a sixth node;
   a fifth capacitor coupled between the sixth node and a load;
   a sixth capacitor coupled between the sixth node and ground;
   a choke inductor coupled between the sixth node and a seventh node; and
   a seventh capacitor coupled between the seventh node and ground, wherein the load impedance is matched to the predetermined value.

9. The transmitter of claim 8, wherein the amplifier impedance matching network further comprises:
   a fourth set of elements including a sixth inductor, a seventh inductor and an eighth capacitor;
   a fifth set of elements including an eighth inductor and a ninth capacitor;
   a sixth set of elements including a ninth inductor and a tenth capacitor, wherein all of the fourth, fifth and sixth sets of elements resonate at the frequency in the first frequency band.

10. The transmitter of claim 9, wherein the seventh inductor is connected in parallel with the eighth capacitor and connected in series to the sixth inductor between the fourth and sixth nodes, the eighth inductor and the ninth capacitor are connected in parallel between the sixth node and ground, and the ninth inductor and the tenth capacitor are connected in series between the fifth capacitor and the load.

* * * * *